United States Patent
Özkök et al.

(10) Patent No.: US 8,987,910 B2
(45) Date of Patent: Mar. 24, 2015

(54) METHOD FOR OBTAINING A PALLADIUM SURFACE FINISH FOR COPPER WIRE BONDING ON PRINTED CIRCUIT BOARDS AND IC-SUBSTRATES

(75) Inventors: Mustafa Özkök, Berlin (DE); Gustavo Ramos, Berlin (DE); Arnd Kilian, Berlin (DE)

(73) Assignee: Atotech Deutschland GmbH, Berlin, DE (US)

( * ) Notice: Subject to any disclaimer, the term of this patent is extended or adjusted under 35 U.S.C. 154(b) by 101 days.

(21) Appl. No.: 13/996,555

(22) PCT Filed: Dec. 16, 2011

(86) PCT No.: PCT/EP2011/073120
§ 371 (c)(1), (2), (4) Date: Jun. 21, 2013

(87) PCT Pub. No.: WO2012/084736
PCT Pub. Date: Jun. 28, 2012

(65) Prior Publication Data
US 2013/0288475 A1    Oct. 31, 2013

(30) Foreign Application Priority Data
Dec. 23, 2010 (EP) .................................. 10196726

(51) Int. Cl.
| | | |
|---|---|---|
| *H01L 23/48* | (2006.01) | |
| *H01L 21/44* | (2006.01) | |
| *H05K 13/04* | (2006.01) | |
| *H01L 23/498* | (2006.01) | |
| *H05K 3/24* | (2006.01) | |
| *H01L 23/00* | (2006.01) | |
| *H01B 1/02* | (2006.01) | |
| *H05K 1/09* | (2006.01) | |

(52) U.S. Cl.
CPC .......... *H05K 13/04* (2013.01); *H01L 23/49866* (2013.01); *H05K 3/244* (2013.01); *H01L 24/03* (2013.01); *H01L 24/05* (2013.01); *H01L 24/85* (2013.01); *H01B 1/02* (2013.01); *H05K 1/09* (2013.01); *H01L 2224/45147* (2013.01); *H01L 2224/85464* (2013.01); *H05K 2203/072* (2013.01); *H01L 24/45* (2013.01); *H01L 24/48* (2013.01); *H01L 2224/03464* (2013.01); *H01L 2224/04042* (2013.01); *H01L 2224/05147* (2013.01); *H01L 2224/05664* (2013.01); *H01L 2224/48227* (2013.01); *H01L 2924/01019* (2013.01); *H01L 2924/14* (2013.01); *H01L 23/49811* (2013.01); *H01L 2224/48864* (2013.01); *H01L 2924/01012* (2013.01); *H01L 2924/01028* (2013.01); *H01L 2924/01029* (2013.01); *H01L 2224/45144* (2013.01); *H01L 2924/01327* (2013.01); *H01L 2224/48599* (2013.01); *H01L 2224/48664* (2013.01); *H01L 2924/01015* (2013.01); *H05K 2203/049* (2013.01); *H05K 2203/095* (2013.01); *H01L 2924/3025* (2013.01); *H01L 2224/45015* (2013.01); *H01L 2224/85045* (2013.01); *H01L 2224/85065* (2013.01); *H01L 2224/85075* (2013.01); *H01L 2924/20105* (2013.01); *H01L 2224/05464* (2013.01)
USPC .......................... 257/762; 438/650; 438/687

(58) Field of Classification Search
USPC .................................. 257/762; 438/650, 687
See application file for complete search history.

(56) References Cited

U.S. PATENT DOCUMENTS

| | | | |
|---|---|---|---|
| 3,754,939 A | 8/1973 | Pearlstein et al. | |
| 3,791,028 A | 2/1974 | Missel | |
| 5,175,609 A | 12/1992 | DiGiacomo et al. | |
| 5,882,736 A | 3/1999 | Stein et al. | |
| 6,221,440 B1 * | 4/2001 | Meyer et al. | 427/537 |
| 6,519,845 B1 | 2/2003 | Cutting et al. | |
| 2005/0151253 A1 | 7/2005 | Nonaka et al. | |
| 2005/0245080 A1 | 11/2005 | Wang et al. | |
| 2006/0055023 A1 | 3/2006 | Ho et al. | |
| 2007/0104929 A1 | 5/2007 | Yim et al. | |
| 2007/0235887 A1 | 10/2007 | Kaimori et al. | |
| 2010/0071940 A1 | 3/2010 | Ejiri et al. | |
| 2010/0181675 A1 | 7/2010 | Reynoso et al. | |
| 2010/0199882 A1 * | 8/2010 | Kojima et al. | 106/1.05 |
| 2013/0062768 A1 * | 3/2013 | Waechtler et al. | 257/750 |

FOREIGN PATENT DOCUMENTS

| | | |
|---|---|---|
| EP | 0697805 | 2/1996 |
| EP | 2469992 | 6/2012 |
| JP | 2008184679 | 8/2008 |
| WO | 2010043502 | 4/2010 |

OTHER PUBLICATIONS

PCT/EP2011/073120; PCT International Search Report and Written Opinion of the International Searching Authority dated Jan. 25, 2012.
P. Steinmetz et al.; "Electroless Deposition of Pure Nickel, Palladium and Platinum", Surface and Coatings Technology, vol. 43-44, Dec. 1, 1990, pp. 500-510.

* cited by examiner

*Primary Examiner* — Minh-Loan Tran
(74) *Attorney, Agent, or Firm* — Renner, Otto, Boisselle & Sklar, LLP

(57) ABSTRACT

The present invention relates to a method of bonding a copper wire to a substrate, particularly a printed circuit board and an IC-substrate, possessing a layer assembly comprising a copper bonding portion and a palladium or palladium alloy layer and a substrate having a copper wire bonded to aforementioned layer assembly.

15 Claims, No Drawings

METHOD FOR OBTAINING A PALLADIUM SURFACE FINISH FOR COPPER WIRE BONDING ON PRINTED CIRCUIT BOARDS AND IC-SUBSTRATES

The present application is a U.S. National Stage Application based on and claiming benefit and priority under 35 U.S.C. §371 of International Application No. PCT/EP2011/073120, filed 16 Dec. 2011, which in turn claims benefit of and priority to European Application No. EP 10196726.3, filed 23 Dec. 2010, the entirety of each of which is hereby incorporated herein by reference.

DESCRIPTION OF THE INVENTION

The present invention relates to a method of bonding a copper wire to a substrate, particularly a printed circuit board and an IC-substrate, possessing a layer assembly comprising a copper bonding portion and a palladium or palladium alloy layer and a substrate having a copper wire bonded to aforementioned layer assembly.

BACKGROUND ART

In printed circuit board (PCB) and integrated circuit (IC) substrate manufacturing it is required that electronic components are bonded to selected bonding areas (bond pads as the bonding portion) of a copper structure produced on one or on both sides of the substrate. Such interconnection must be reliable in terms of bond strength, i.e., thermal stress imposed on a bonding interconnection must by no means result in a break of this interconnection.

Wire bonding is one of the preferred processes for connecting the chip to the IC-substrate in IC packages and it accounts for more than 70% of the commercial IC production. Currently the main wire bonding process used for IC-substrate is gold wire bonding, wherein a gold wire is bonded on a layer of electrolytically deposited nickel and gold. Alternatively, the gold wire is bonded onto a surface of nickel, palladium and gold (ENEPIG). In all cases, the copper wire is bonded onto the final gold layer. Recently, copper wire bonding technology has been introduced into the IC-substrate Industry as an alternative to gold wire bonding. Currently the standard for copper wire bonding is to use copper wire bonds bonded onto a layer sequence consisting of a first electrolytic nickel and second gold layer deposited onto the copper wire bonding portions of the substrate.

The mechanical reliability of wire bonds in microelectronic package depends to a big extent on the formation and development of intermetallic compounds at the interface between the bond wedge and the bond pad on the substrate (printed circuit board, PCB or IC-substrate), which is strictly needed for successful bonding.

Bonding either gold or copper-wires onto a copper bond pad surface is difficult mainly because of the high tendency of the copper metallization to oxidise.

Wire bonding portions are typically made of copper. If they remain bare or are externally exposed to atmosphere and humidity, soldering and wire bonding properties of the copper layers deteriorate due to oxidation or corrosion of the surface. In order to maintain soldering or wire bonding properties, therefore, the bare or exposed copper layers are usually electroplated or electroless plated with nickel. The plated nickel layer protects the copper from an erosive atmosphere for a long period of time. Also, the nickel layer protects the copper from being dissolved by solder during the soldering assembly step by functioning as a diffusion barrier layer. In addition, the plated nickel layer plays a role as an interfacial film for preventing the copper layer and the gold layer, to be plated later, from diffusing into each other. Thereafter, wire bonding gold is plated to a thickness of around 0.5 µm in an electrolytic or electroless manner, so as to impart properties facilitating a wire bonding process. Such processes are for example described in U.S. Pat. No. 5,235,139 and U.S. Pat. No. 6,733,823. US 2007/0104929 relates to a method for plating a printed circuit board, comprising the steps of: (a) providing a printed circuit board with predetermined circuit patterns, having a wire bonding portion for surface mounting semiconductors thereon and a soldering portion for connecting external parts with the printed circuit board; (b) forming a photo solder resist layer to the remaining portions exclusive of the wire bonding portion and the soldering portion in the printed circuit board; (c) forming an electroless palladium or palladium alloy plated layer on the wire bonding portion and the soldering portion; and (d) immersing the palladium or palladium alloy plated layer with a substitution type immersion gold plating solution containing a water-soluble gold compound to form an electroless gold or gold alloy plated layer on the palladium or palladium alloy plated layer.

US 2006/055023 concerns a chip carrier comprising a laminated layer and an oxidation protection layer. The oxidation protection layer is a non-electrolytic metallic coating or an organic oxidation protection film on the surface of bonding finger pads or other contacts formed by deploying a simple, fast film-coating technique.

U.S. Pat. No. 5,175,609 relates to new structures and methods for corrosion- and stress-resistant interconnecting multilayer metallurgical pad comprising sequentially deposited layers of chromium, nickel and noble or relatively noble metal as the interconnecting metallurgy, or multilayer metallurgical pad comprising sequentially deposited layers of chromium, soluble noble metal, nickel and noble or relatively noble metal as the interconnecting metallurgy.

EP 0 697 805 A1 relates to a way of manufacturing printed circuit boards by providing a circuit board with a circuit pattern, holes and lands of copper; covering the circuit pattern with a soldermask; and contacting the board with an electroless palladium solution for a sufficient time to provide a final finish layer of palladium at a sufficient thickness to protect the copper deposits in the holes and on the lands from oxide formation and being relatively smooth and flat to provide good solderability and good wire bonding capabilities. The copper circuit pattern, holes and lands is generally provided by plating copper onto the board. Then, the palladium layer may be provided directly onto the copper or onto a layer of electroless nickel which is initially deposited upon the copper.

SUMMARY OF THE INVENTION

Therefore, it is an object of the present invention to provide a layer to be deposited on a substrate bearing a wire bonding portion made of copper that ensures good reliability of wire bonds to be formed and does not contain a gold layer. Metal layer as used herein means at least one metal layer made of palladium or palladium alloy formed on the wire bonding portion which is suitable as a surface for copper wire bonding.

It is still another object of the present invention to provide a method of forming said layer while allowing for stable wire bonds, more specifically copper wire bonds to be formed on such metal layer.

It is still another object of the present invention to provide an IC-substrate, said IC-substrate having a copper structure, wherein the copper structure is coated with the metal layer.

It is still another object of the present invention to provide a printed circuit board, said printed circuit board having a copper structure, wherein the copper structure is coated with the metal layer.

To achieve these objects, the present invention provides a metal layer assembly, comprising
(i) at least one wire bonding portion layer made of copper or copper alloy; and deposited thereon
(ii) a metal layer being a palladium or palladium alloy layer
(iii) a copper wire bonded onto the palladium or palladium alloy layer.

The palladium or palladium alloy layer as deposited in step (ii) has a thickness of 0.01-5.0 µm, preferably 0.05-2.0 µm and even more preferred 0.1-0.5 µm.

In a preferred embodiment of the method, the palladium layer consists of pure palladium. In another preferred embodiment the layer assembly does not contain nickel or a nickel alloy layer on the wire bonding portion but only a palladium or palladium alloy layer plated directly onto the wire bonding portion.

The palladium is deposited from an electroless (autocatalytic) plating palladium bath comprising
a palladium ion source;
a complexing agent;
a reducing agent.

Hitherto, it was common to plate a nickel or nickel alloy layer onto the wire bonding portion layer made of copper or copper alloy. Such nickel layer generally had a thickness of 0.5-10.0 µm. This is no longer required in the process according to the present invention.

The inventors have found that it is particularly advantageous to apply a pure palladium layer onto the copper or copper alloy of the wire bonding portion. Pure palladium is even more preferred according to an embodiment wherein no nickel or nickel alloy layer is deposited on the wire bonding portion made of copper or copper alloy prior to palladium or palladium layer plating. A pure palladium layer according to the present invention is a layer comprising a palladium content of more than 99.0 wt. %, preferred more than 99.5 wt. % palladium or even more preferred more than 99.9 wt. % or more than 99.99 wt.-%. palladium.

In another embodiment of the method, the palladium plated layer is an alloy layer which comprises 90 to 99.9 wt % of palladium, and 0.1 to 10.0 wt % of phosphorus or boron.

In a preferred embodiment of the present invention the metal layer only comprises one layer being a palladium or palladium alloy like palladium-phosphorus layer, which is directly formed on the copper or copper alloy wire bonding portion of the substrate.

Generally, the copper or copper alloy surface of the bonding portion usually is prepared for plating by prior treatment with an acid cleaner and then the surface copper oxides are reduced in a micro-etch bath.

For the purpose of the present invention it can be useful to apply an additional activation step to the copper or copper alloy wire bonding portion prior to depositing the palladium or palladium alloy layer. Such activation solution can comprise a palladium salt which results in a thin palladium layer. Such layer is very thin and usually does not cover the entire copper or copper alloy wire bonding portion. It is not considered a distinct layer of the layer assembly but rather an activation, which forms a metal seed layer in addition to the palladium/palladium alloy layer. Such seed layer is typically a few angstroms in thickness. Such seed layer is plated to the copper or copper alloy layer by an immersion exchange process.

Such activation solution is particularly preferred if the deposition of the palladium layer is by an electroless (autocatalytic) plating method.

This palladium/palladium alloy layer is preferably plated to the copper or copper alloy structure, which is provided on an IC-substrate or printed circuit board.

An IC-substrate comprises a carrier corpus and the copper structure, which is provided on one or both sides of said carrier corpus. Hence, the metal structure is coated with the palladium or palladium alloy layer. Thereafter, a copper wire is bonded onto the palladium or palladium alloy layer.

The copper wire preferably is a pure copper wire. Alternatively, it can be a copper alloy wire. Also, the copper wire or copper alloy wire can be coated with gold or palladium, palladium being preferred. The palladium coating can e.g. have a thickness of between 5-50 nm, preferably 10-25 nm. The gold coating can have the same thickness range.

The copper structure comprises a wire bonding portion (also called bond pads), which serve the connection of electronic components to the substrate, conductor lines, which serve the electrical connection between pads and between metalized holes and pads, and other conductor areas, like ground areas, shielding areas and the like. The palladium or palladium alloy layer is preferably coated to the solder and bonding portion only, but not on the conductor lines and the other conductor areas.

In contrast to the prior art, the layer assembly of the present invention provides for most reliable bond connections between an electronic component and the substrate.

The layer assembly of the present invention also does not contain a gold layer plated onto the palladium or palladium alloy layer. This not only results in substantial savings regarding the overall process costs. The inventors also found that by omitting the gold layer the wire bonding performance is greatly enhanced.

The method of the invention preferably comprises depositing of the palladium or palladium alloy layer by electroless (autocatalytic) plating. Electroless (autocatalytic) plating involves depositing the metal by reducing same with the help of a reducing agent which is contained in the electroless plating solution, this reducing agent being oxidized thereupon. The substrate metal will thereupon be oxidized and hence dissolved. No reducing agent being contained in the plating solution is used in this case.

Further, the pure palladium layer may preferably be deposited by bringing the at least one copper wire portion of the substrate into contact with a solution containing a palladium ion source and a reducing agent, which does not contain phosphorous and results in a deposition of a pure palladium layer.

A suitable electroless (autocatalytic) plating bath composition to deposit layers of pure palladium is for example described in U.S. Pat. No. 5,882,736. Such plating bath contains a palladium salt, one or more nitrogenated complexing agents, and formic acid or formic acid derivatives, but not hypophosphite and/or amine borane compounds. The pH value of the solution is above 4. Preferably, primary, secondary or tertiary amines or polyamines are used as the nitrogenated complexing agents. They are, for example, ethylenediamine; 1,3-diamino-propane, 1,2-bis(3-amino-propyl-amino)-ethane; 2-diethyl-amino-ethyl-amine; and diethylene-triamine. In addition, diethylene-triamine-penta-acetic acid; nitro-acetic acid; N-(2-hydroxy-ethyl)-ethylene-diamine; ethylene-diamine-N,N-diacetic acid; 2-(dimethyl-amino)-ethyl-amine; 1,2-diamino-propyl-amine; 1,3-diamino-propyl-amine; 3-(methyl-amino)-propyl-amine; 3-(dimethyl-amino)-propyl-amine; 3-(diethyl-amino)-propyl-amine; bis(3-amino-propyl)-amine; 1,2-bis(3-amino-propyl)-alkyl-amine; diethylene-triamine; triethylene-tetramine; tetra-ethylene-pentamine; penta-ethylene-hexamine; and any desired mixtures of these nitrogenated complexing agents may also be used. However, sulfur containing compounds are not used as stabilizers together with the complexing agents.

More preferably the solution used to deposit the pure palladium layer in an electroless manner is aqueous and contains a palladium salt, such as palladium chloride or palladium sulfate, a non-hypophosphite containing compound as a reducing agent like formic acid, mineral acids, such as sulfuric acid and hydrochloric acid, or mineral bases, like sodium or potassium hydroxide, complexing agents, like amine compounds, such as ethylene diamine, and, if necessary, stabilizing compounds. Alternatively, other electroless palladium deposition solutions and processes may be used which are well-known in the art and which are described in: U.S. Pat. Nos. 5,292,361, 4,424,241, 4,341,846, 4,279,951 and 4,255,194.

In a further preferred embodiment of the invention, one or both sides of the substrate is/are provided with a conformal mask, said conformal mask covering all regions on said one or both sides of said substrate except those regions on said one or both sides where the palladium or palladium alloy layer is to be coated on the at least one copper wire portion. The conformal mask may preferably be a solder mask, like an exposable and developable mask. Such mask can be based on epoxy resin for example and is laminated, spin-coated, roller-coated or the like to the surface(s) of the circuit carrier. Thereafter it is exposed to actinic light and developed to uncover those regions on the surface(s) where the layer assembly is to be deposited. It is these regions where the wire bonding portions are to be provided. The conformal mask may be formed such that the uncovered regions on the surface(s) of the substrate are larger than the wire bonding portions formed in the copper structure, thereby exposing parts of dielectric surface regions of the substrate, or smaller than the wire bonding portions formed in the copper structure, such that only the wire bonding portions formed in the copper structure are uncovered.

DETAILED DESCRIPTION OF THE INVENTION

According to the process of the present invention an exposed wire bonding portion made of copper or copper alloy is plated with a pure palladium or a palladium alloy layer.

The palladium alloy layer preferably is a palladium-phosphorous layer having a phosphorous content of 0.1-10 wt.-%, more preferred 0.5-7 wt.-%. A pure palladium layer according to the present invention is a layer comprising a palladium content of more than 99.0 wt. %, preferred more than 99.5 wt. % palladium or even more preferred more than 99.9 wt. % or more than 99.99 wt.-%. palladium. A pure palladium layer is preferred.

On the exposed wire bonding portions palladium or a palladium alloy is plated to form a palladium or palladium alloy plated layer.

Below, a more detailed description is given of the formation of the electroless palladium or palladium alloy plated layer on the wire bonding portion.

The reducing agent employed in the plating solution determines whether pure palladium or a palladium alloy (palladium-phosphorus, palladium-boron) is plated. For example, a typical electroless palladium plating solution useful in the present invention comprises palladium sulfate as a palladium source, sodium hypophosphite or dimethyl amine borane, formaldehyde or formic acid as a reducing agent, lactic acid as a complexing agent, and succinic acid as a buffer, but is not limited thereto. In order to obtain a denser structure of palladium plated layer, the pH of the electroless palladium plating solution preferably falls in the range from 4.5 to 5.5.

The palladium or palladium alloy plating process is conducted at about 45 to 80° C. for 1 to 60 min to give a palladium or palladium alloy plated layer ranging in thickness from 0.05 to 5.0 µm, more preferred from 0.1 to 1.0 µm and even more preferred 0.1 to 0.5 µm.

The strength of the complexing agents in the bath depends on the palladium content. Typically, the mole ratios of the complexing agents to the palladium are from 5:1 to 50:1, whereby the strength of the complexing agents in the bath is 0.05 g/liter to 100 g/liters of bath.

The pH-value of the coating solution is generally greater than 4. At pH-values below 4, the solution becomes unstable and tends to self-decompose as hydrogen is produced. At pH-values slightly below 4, mainly poorly adhesive and dark palladium layers are deposited on the metal surfaces, while at pH-values lower than about 2 palladium precipitates out of the solution. In this case, the precipitates obtained on the substrate are black and inadequately adhesive.

The preferred pH-value of the coating solution is in the range from 5 to 6. At pH-values greater than 7, the tendency of the alkali bath to deposit palladium on the metal surfaces in a cementative fashion, i.e., not brightly glossy or adhering to the substrate increases. Furthermore, alkali coating solutions would attack the organic resistance films such as, for example, the solder stop masks, applied to the circuit board.

If the pure palladium layer is directly deposited on the copper or copper alloy layer of the wire bonding portion a pretreatment of the copper surface is advisable. For this purpose, etch cleaning is usually carried out in oxidizing, acidic solutions, for example a solution of sulfuric acid and hydrogen peroxide. Preferably, this is followed by another cleaning in an acidic solution, such as, for example, a sulfuric acid solution. After cleaning, the surfaces are preferably activated with a solution containing palladium such as, for example, a palladium sulfate solution, which contains additional acids like sulfuric acid, methane sulfonic acid and phosphoric acid. Typically, the substrates are immersed in the activation bath at 25 to 30° C. for one to four minutes.

This activation step is preferred for the following reason: The subsequent deposition step, e.g. in an electroless (autocatalytic) palladium bath, the bath contains a reducing agent that is catalytically activated by the presence of palladium metal. Therefore, at least some palladium has to be deposited on the copper surface by an immersion process, in which the more noble metal palladium displaces the less noble copper. This initial immersive palladium deposition may take place also if the copper surface is immersed directly into an autocatalytic palladium bath, and once a minute amount of palladium has been deposited, the process proceeds as an autocatalytic deposition. Autocatalytic palladium bath compositions were found to be deactivated by an excess of copper ions. If the initial immersive palladium deposition is performed in the autocatalytic palladium bath, inevitably enrichment with copper ions occurs. Therefore, in a production environment it can be preferable to apply an immersion palladium bath (activation solution described before) in an extra step before the autocatalytic palladium bath to prolong the lifetime of the latter.

After this, in a preferred embodiment, the surfaces can be rinsed and then, after pre-treatment in the activation palladium bath described above, be treated with an electroless (autocatalytic) palladium bath described above; in another case, they can be immediately treated with the electroless (autocatalytic) palladium bath without pre-treatment in the activation palladium bath.

The following examples serve to illustrate various aspects of the present invention.

EXAMPLES

As substrate a single sided PCB (array size 61.8×113.8 mm) is used. The array consists of two single cards (50×50 mm). The total copper thickness is 30 μm (+/−5 μm). Wire bonding can be performed on any area of said substrate.

The base material is Hitachi MCL-E679FGB-(S), FR4 18/80, 300 μm.

The plating sequence applied is shown in the Tables below:

TABLE 1A

Plating of pure palladium on the copper wire bonding portion (according to the present invention)

| | Process Step | Substance | Temperature [° C.] | Process Time [min] |
|---|---|---|---|---|
| 1 | Cleaner | Cleaner SF | 40 | 5 |
| 2 | Rinse | DI Water | RT | 2 |
| 3 | Micro Etch | Micro Etch | 35 | 2 |
| | Rinse | DI Water | RT | 2 |
| 4 | Pre Dip | Pre Dip Pd Activator | RT | 3 |
| 5 | Activation | Pd Activator | RT | 2 |
| 6 | Rinse | DI Water | RT | 2 |
| 7 | Electroless Pd | Electroless Pd | 50 | 10 |
| 8 | Rinse | DI Water | RT | 2 |
| 13 | Hot rinse | DI-Water (<2 μS/cm) | 50 | 1 |
| 14 | Drying | — | 60 | 15 |

TABLE 1B

Plating of palladium on the copper pads using an immersion process (comparative)

| | Process Step | Substance | Temperature [° C.] | Process Time [min] |
|---|---|---|---|---|
| 1 | Cleaner | Cleaner SF | 40 | 5 |
| 2 | Rinse | DI Water | RT | 2 |
| 3 | Micro Etch | Micro Etch | 35 | 2 |
| 4 | Rinse | DI Water | RT | 2 |
| 5 | Immersion Pd | Immersion Pd bath | RT | 8 |
| 6 | Rinse | DI Water | RT | 2 |
| 7 | Hot rinse | DI-Water (<2 μS/cm) | 50 | 1 |
| 8 | Drying | — | 60 | 15 |

TABLE 2

Plating of nickel and pure palladium on the copper wire bonding portion

| | Process Step | Substance | Temperature [° C.] | Process Time [min] |
|---|---|---|---|---|
| 1 | Cleaner | Cleaner SF | 40 | 5 |
| 2 | Rinse | DI Water | RT | 2 |
| 3 | Micro Etch | Micro Etch | 35 | 2 |
| | Rinse | DI Water | RT | 2 |
| 4 | Pre Dip | Pre Dip $H_2SO_4$ 5% | RT | 3 |
| 5 | Activation | Ni Activator | RT | 1:30 |
| 6 | Rinse | DI Water | RT | 2 |
| 7 | Electroless Ni | Electroless Ni | 85 | 30 |
| 8 | Rinse | DI Water | RT | 2 |
| 9 | Electroless Pd | Electroless Pd | 50 | 10 |
| 10 | Rinse | DI-Water | RT | 2 |
| 11 | Hot rinse | DI-Water (<2 μS/cm) | 50 | 1 |
| 12 | Drying | — | 60 | 15 |

TABLE 3

Plating of nickel and palladium-phosphorous alloy on the copper wire bonding portion

| | Process Step | Substance | Temperature [° C.] | Process Time [min] |
|---|---|---|---|---|
| 1 | Cleaner | Cleaner SF | 40 | 5 |
| 2 | Rinse | DI Water | RT | 2 |
| 3 | Micro Etch | Micro Etch | 35 | 2 |
| | Rinse | DI Water | RT | 2 |
| 4 | Pre Dip | Pre Dip $H_2SO_4$ 5% | RT | 3 |
| 5 | Activation | Ni Activator | RT | 1:30 |
| 6 | Rinse | DI Water | RT | 2 |
| 7 | Electroless Ni | Electroless Ni | 85 | 30 |
| 8 | Rinse | DI Water | RT | 2 |
| 9 | Electroless Pd—P | Electroless Pd—P | 50 | 10 |
| 10 | Rinse | DI-Water | RT | 2 |
| 11 | Hot rinse | DI-Water (<2 μS/cm) | 50 | 1 |
| 12 | Drying | — | 60 | 15 |

TABLE 4

Plating of nickel, pure palladium and gold on the copper wire bonding portion (comparative)

| | Process Step | Substance | Temperature [° C.] | Process Time [min] |
|---|---|---|---|---|
| 1 | Cleaner | Cleaner SF | 40 | 5 |
| 2 | Rinse | DI Water | RT | 2 |
| 3 | Micro Etch | Micro Etch | 35 | 2 |
| | Rinse | DI Water | RT | 2 |
| 4 | Pre Dip | Pre Dip $H_2SO_4$ 5% | RT | 3 |
| 5 | Activation | Ni Activation | RT | 1:30 |
| 6 | Rinse | DI Water | RT | 2 |
| 7 | Electroless Ni | Electroless Ni | 85 | 30 |
| 8 | Rinse | DI Water | RT | 2 |
| 9 | Electroless Pd | Electroless Pd | 50 | 10 |
| 10 | Rinse | DI-Water | RT | 2 |
| 11 | Immersion Au | Immersion Au | 82 | 10 |
| | Autocatalytic Au | Autocatalytic Au | 82 | 12 |
| 12 | Hot rinse | DI-Water (<2 μS/cm) | 50 | 1 |
| 13 | Drying | — | 60 | 15 |

Components used according to Tables 1 A/B-4:

| | |
|---|---|
| Cleaner | Cleaner SF |
| | 25 g/l organo sulfonic acid |
| | 10 g/l glycol ether |
| Micro Etch | Micro Etch |
| | 500 g/l potassium caroate |
| Pre Dip | Ni-Activator Pre Dip |
| | 10 wt.-% sulfuric acid |
| Ni-Activator | 100 mg/l $PdSO_4$ |
| | 150 ml/l $H_2SO_4$ |
| Electroless Ni | 30 g/l hypophosphite |
| | 20 g/l malic acid |
| | 30 g/l lactic acid |
| | 6 g/l Ni(II) ions from nickel sulfate |
| Pre Dip Pd-Activator | 50 g/l Phosphoric Acid 85% |
| | 11 g/l Sodium Nitrate |

-continued

| | |
|---|---|
| Pd-Activator | 50 g/l Phosphoric Acid 85% |
| | 10 g/l Methane Sulfonic Acid 70% |
| | 0.15 g/l Palladium Sulfate |
| Electroless Pd | 30 g/l ethylenediamine |
| | 400 g/l reducing agent |
| | 1 g/l Pd(II) ions from palladium sulfate |
| Electroless Pd—P | 100 g/l ethylenediamine |
| | 40 g/l reducing agent |
| | 0.6 g/l Pd(II) ions from palladium sulfate |
| Immersion Pd | 50 g/l Phosphoric Acid 85% |
| | 10 g/l Methane Sulfonic Acid 70% |
| | 0.30 g/l Palladium Sulfate |
| Immersion Au | 30 g/l EDTA |
| | 30 g/l hydroxycarboxylic acid |
| | 8 g/l $Na_2SO_3$ |
| | 1.47 g/l $K[Au(CN)_2]$ |

Tests Performed:
Pulls Tests

After deposition of the metal layer(s) as described in the Tables 1 A/B-4, the such plated wire bonding portions were bonded on portions of the copper pads with Heraeus Maxsoft copper wire (diameter 0.8 μm) at 165° C. The Cu bonding process was performed using a Kulicke and Soffa Max Ultra wire bonder with a Microenvironment Copper Kit. Forming gas (5%/95% $H_2/N_2$) protected the free-air ball during formation. The bonding tool was a Kulicke and Soffa CuPRA-plus capillary with 1.25 mil chamfer diameter (CD) and 60° inner chamfer angle (ICA). Bonding was in the presence of ultra sonic (US) treatment.

The palladium surface was cleaned with a plasma-etch process prior to bonding, which is known in the art.

The pull tests were performed on a Dage 4000 T p pull tester.

The test results are shown in Table 5. A number of 10 bonded samples was tested and the average value provided in Table 5. Test "Table No." indicates the plating sequence according to Tables 1 A/B-4 above. The thicknesses of the resulting metal layers are provided in μm. The US treatment time is varied between 90 and 140 seconds (s). The corresponding pull strength values in g pull force are provided in Table 5.

US (ultra sonic) treatment time

TABLE 5

Results of average pull strength values obtained

| Samples No. | Test Table No. | Ni [μm] | Pd [μm] | Au [μm] | 90 [s] | 100 [s] | 110 [s] | 120 [s] | 120 [s] | 130 [s] | 130 [s] | 140 [s] |
|---|---|---|---|---|---|---|---|---|---|---|---|---|
| 1A | 1A | — | 0.3 | — | 7.0 | 6.4 | 6.5 | 5.3 | 6.0 | 5.3 | 5.9 | 5.3 |
| 1B* | 1B | — | 0.3 | — | 3.0 | 2.9 | 2.7 | 2.7 | 2.4 | 3.0 | 2.9 | 2.5 |
| 2 | 2 | 7 | 0.3 | — | 4.3 | 3.7 | 4.5 | 4.4 | 4.8 | 4.3 | 4.6 | 4.2 |
| 3 | 3 | 7 | 0.3 | — | 2.3 | 2.9 | 3.5 | 4.0 | 3.8 | 4.1 | 3.6 | 4.9 |
| 4* | 4 | 7 | 0.3 | 0.05 | 1.3 | 1.8 | 2.1 | 2.3 | 2.4 | 3.0 | 2.7 | 3.1 |

*comparative example

As becomes apparent from the data of Table 5 pull strength values for Sample No. 1 A are highest at all US treatment times. The higher the pull strength value the superior the bond between the substrate and the copper wire is, what is desired. A bond strength value below 2.1 is considered not sufficient to form a reliable bond between the substrate and the copper wire, a value between 2.2 and 3.9 is considered acceptable. Values 4.0 or higher are considered to be good. When using am immersion palladium plating process (Samples No. 1B) to plate the palladium layer the bonding performance is much poorer as compared to an electroless (autocatalytic) plating process of the present invention.

All values for sample No. 1 are higher than 5, i.e. very good. This example corresponds to the particularly preferred embodiment of the invention wherein the palladium layer is a pure palladium layer and is directly deposited onto the copper wire bonding portion without an intermediate nickel or nickel alloy layer.

Samples Nos. 2 and 3 were also obtained by a method according to the present invention and contained an additional nickel layer between the substrate (more specifically the wire bonding portion) and the palladium layer. The average pull strength values obtained are lower than according to the preferred embodiment, but still acceptable.

Adding a gold layer (Samples No. 4) according to an experiment corresponding to a comparative example as a final layer of the assembly surprisingly results in far inferior average pull strength values obtained. Thus, the bonding performance is inferior. Three out of eight values are considered "fail", five out of eight are "acceptable" and no value is considered very good.

Hitherto, it was believed that gold was the most suitable layer for wire bonding.

Thus, with a method according to the present invention it is provided a layer sequence offering very good copper wire bonding results with regards to the average pull strength values obtained which indicates good bonding between copper wire and surface finishing of the substrate.

Additional bonding tests were performed for samples prepared according to plating processes according to Tables 1 A (electroless (autocatalytic) plating process, invention) and 1 B (immersion plating process, comparative) in order to establish that the process according to the present invention results is superior bonding performance.

Four samples (with two different palladium layer thicknesses) as listed below were tested on Cu wire bondability:

TABLE 1 A

Electroless Pd (Autocatalytic) 90 nm (Pd thickness 90 nm)
Electroless Pd (Autocatalytic) 150 nm (Pd thickness 150 nm)

TABLE 1B

Immersion Pd 100 nm, (Pd thickness 100 nm)
Immersion Pd 150 nm, (Pd thickness 150 nm)

Test conditions were "as received" status (fresh plated without thermal treatment) and after 4 h at 150° C. thermal treatment. All samples plated with electroless (autocatalytic) palladium were bondable with Cu wire under both test conditions. From the samples plated with Immersion Pd only the sample "Immersion Pd 150 nm" was bondable under "as received" condition. The sample "Immersion Pd 100 nm" was not bondable in both test conditions, the sample "Immersion Pd 150 nm" was not bondable after the thermal treatment "4 h 150° C.". The samples failed during the wire bonding process. So no wires could be fixed on the surface and no wire pull test was possible. Additionally both samples plated with Immersion Pd showed a strong discoloration after the thermal treatment.

Bonding equipment and parameters were the same as above described unless otherwise stated with the following detailed parameter setting. Copper wire used: Hereaus Cu Maxsoft, Ø=20 μm, break load 7.3 g, Temperature: 200° C.

TABLE 6

Parameter Settings Used for Wire Bond Test

| Parameter | Ballbond | Wedgebond |
|---|---|---|
| US-Power [mAmps] | 140 | 170 |
| US-Time [ms] | 13 | 12 |
| Bond Force [g] | 30 | 35 |
| CV [mils/ms] | 0.20 | 0.40 |

Per sample 30 pulls were performed. The Pulltest Acceptance Criteria is according to DVS 2811 recommendations: Minimum break force >50% of B. load of wire (>4.95 g); Coefficient of variation CV (ratio of std. dev. to mean value) <0.15 (<15%). Before bonding, all samples were pretreated with argon plasma for 10 minutes.

TABLE 7

Pull Strength (g) By Surface Finish; Ageing = as received

| Deposited layer | Number | Mean |
|---|---|---|
| Electroless Pd (Autocatalytic) 90 nm | 30 | 6.5 |
| Electroless Pd (Autocatalytic) 150 nm | 30 | 5.0 |
| Immersion Pd 100 nm | | Sample not bondable. |
| Immersion Pd 150 nm | 30 | 4.5 |

TABLE 8

Pull Strength (g) By Surface Finish; Ageing = 4 h 150° C.

| Deposited layer | Number | Mean |
|---|---|---|
| Electroless Pd (Autocatalytic) 90 nm | 30 | 5.4 |
| Electroless Pd (Autocatalytic) 150 nm | 30 | 5.3 |
| Immersion Pd 100 nm | | Sample not bondable. |
| Immersion Pd 150 nm | | Sample not bondable. |

As becomes apparent from Tables 7 and 8 bonding performance on palladium layers obtained by electroless (autocatalytic) palladium deposition is higher than for those obtained by immersion deposition. After ageing and at a thickness of 100 nm, immersion plated palladium layers are not bondable at all and thus not suitable for a bonding process according to the present invention.

The invention claimed is:

1. A method for forming a copper wire on a substrate, said substrate having at least one wire bonding portion made of copper or copper alloy comprising the steps of
   (i) providing a substrate having at least one wire bonding portion made of copper or copper alloy;
   (ii) forming a palladium layer on the at least one wire bonding portion, wherein the palladium is deposited from an electroless (autocatalytic) plating palladium bath comprising
   a palladium ion source;
   a complexing agent;
   a reducing agent
   and wherein the palladium content is more than 99.9 wt-%; and thereafter
   (iii) bonding a copper wire onto the palladium layer.

2. The method according to claim 1, wherein the palladium layer according to step (ii) is formed directly upon the copper or copper alloy bonding portion.

3. The method according to claim 1, wherein the palladium layer has a thickness of 0.05-5.0 μm.

4. The method according to claim 1, wherein the palladium layer has a thickness of 0.1-0.5 μm.

5. The method according to claim 1, wherein the reducing agent is formic acid or a salt thereof.

6. The method according to claim 1, wherein copper wire is a pure copper or copper alloy wire which is coated with gold or palladium layer.

7. The method according to claim 6, wherein the palladium or gold layer coating has a thickness of between 5-50 nm.

8. The method according to claim 1, wherein prior to step (ii) the at least one wire bonding portion is activated by immersing it into a solution containing palladium ions.

9. A layer assembly comprising
   (i) at least one wire bonding portion layer made of copper or copper alloy; and directly deposited thereon
   (ii) a palladium layer having a thickness of 0.05-0.5 μm and having a palladium content of more than 99.9 wt-%; and
   (iii) a copper wire bonded onto the palladium layer.

10. A printed circuit board possessing a layer assembly according to claim 9 further comprising a soldering portion for connecting external parts with the printed circuit board.

11. An integrated circuit possessing a layer assembly according to claim 9.

12. A method for forming a layer assembly, the layer assembly comprising:
   (i) at least one wire bonding portion layer made of copper or copper alloy; and directly deposited thereon
   (ii) a palladium layer having a thickness of 0.05-0.5 μm and having a palladium content of more than 99.9 wt-%; and
   (iii) a copper wire bonded onto the palladium layer;
   the method comprising:
   (i) providing a substrate having the at least one wire bonding portion made of copper or copper alloy;
   (ii) forming the palladium layer on the at least one wire bonding portion, wherein the palladium is deposited from an electroless (autocatalytic) plating palladium bath comprising
   a palladium ion source;
   a complexing agent;
   a reducing agent
   and wherein the palladium content is more than 99.9 wt-%; and thereafter
   (iii) bonding the copper wire onto the palladium layer.

13. The method according to claim 12, wherein prior to step (ii) the at least one wire bonding portion is activated by immersing it into a solution containing palladium ions.

14. A printed circuit board possessing a layer assembly formed according to the method of claim 12 further comprising a soldering portion for connecting external parts with the printed circuit board.

15. An integrated circuit possessing a layer assembly formed according to the method of claim 12.

* * * * *